United States Patent
Zhang et al.

(10) Patent No.: US 8,514,587 B2
(45) Date of Patent: Aug. 20, 2013

(54) CONDUCTIVE STRUCTURE

(75) Inventors: Jun-Yong Zhang, Shenzhen (CN); Peng Wang, Shenzhen (CN)

(73) Assignees: Innocom Technology (Shenzhen) Co., Ltd., Shenzhen, Guangdong Province (CN); Chimei Innolux Corporation, Miao-Li County (TW)

(*) Notice: Subject to any disclaimer, the term of this patent is extended or adjusted under 35 U.S.C. 154(b) by 207 days.

(21) Appl. No.: 12/882,216

(22) Filed: Sep. 15, 2010

(65) Prior Publication Data
US 2011/0083882 A1 Apr. 14, 2011

(30) Foreign Application Priority Data
Oct. 8, 2009 (CN) .......................... 2009 1 0308086

(51) Int. Cl.
*H05K 1/11* (2006.01)
*H05K 1/14* (2006.01)

(52) U.S. Cl.
USPC ........... 361/803; 361/795; 174/259; 174/260; 174/262

(58) Field of Classification Search
USPC ...................... 174/259–264, 254; 349/49–56; 361/792–795, 803
See application file for complete search history.

(56) References Cited

U.S. PATENT DOCUMENTS
| 5,473,120 A * | 12/1995 | Ito et al. .......................... 174/264 |
| 5,575,662 A * | 11/1996 | Yamamoto et al. ............. 439/67 |
| 2005/0209392 A1 | 9/2005 | Luo et al. |
| 2009/0040415 A1 * | 2/2009 | Kim ................................ 349/56 |

FOREIGN PATENT DOCUMENTS
| TW | M566796 | 12/2003 |
| TW | M329210 | 3/2008 |

OTHER PUBLICATIONS

Taiwan Intellectual Property Office, "Office Action", Mar. 14, 2013, Taiwan.

* cited by examiner

*Primary Examiner* — Tuan T Dinh
(74) *Attorney, Agent, or Firm* — WPAT, PC; Justin King

(57) ABSTRACT

The present disclosure relates to a conductive structure. The conductive structure includes a first conductive layer, a conductive unit, a circuit board and a conductive material. The conductive unit is disposed on the first conductive layer. The circuit board having a first through hole is disposed on the first conductive layer. The conductive unit is exposed to the first through hole. The first through hole is filled with a conductive material, such that the conductive material is electrically connected to the conductive unit.

9 Claims, 3 Drawing Sheets

CONDUCTIVE STRUCTURE

BACKGROUND OF THE DISCLOSURE

1. Field of the Disclosure

The disclosure relates in general to a conductive structure and a method of a manufacturing the same, and more particularly to a conductive structure applied to touch panel and a method of manufacturing the same.

2. Description of Related Art

Portable electronic products, such as personal digital assistant (PDA), smart phone, digital camera, and game station, are widely used and directed towards the design of thinness and smart functions. The display devices of the portable electronic products normally adopt a structure of a liquid crystal display (LCD) with a touch panel. It is hard to planarize conventional touch panels. Therefore the conventional touch panel has been gradually replaced by a full flat touch panel (such as touch lens or touch window).

FIG. 1 shows a structural diagram of a conventional full flat touch panel 1. The full flat touch panel 1 mainly includes a decoration film 10, an upper conductive layer 12 made from indium tin oxide (ITO), a lower conductive layer 14 made from ITO, a plastic substrate 16 and a flexible circuit board (FPC) 18. The upper conductive layer 12 and the lower conductive layer 14 respectively have a silver electrode 20 disposed thereon. One end of the flexible circuit board 18 is dispoed between the upper and the lower silver electrodes 20. Since the electrical connection between the flexible circuit board 18 and the silver electrode 20 is bonded through a thermal compression bonding process, the surface of the full flat touch panel 1 is thus uneven. In other words, the surface of the leading position of the flexible circuit board 18 will be uneven, such that the aesthetics of the appearance of the electronic devices is deteriorated.

SUMMARY OF THE DISCLOSURE

In view of the needs, the present disclosure relates a conductive structure making a surface of a full flat touch panel smooth and a method of manufacturing the same.

According to a first aspect of the present disclosure, a conductive structure is provided. The conductive structure includes a first conductive layer, a conductive unit, a circuit board and a conductive material. The conductive unit is disposed on the first conductive layer. The circuit board having a first through hole is disposed on the first conductive layer, and the conductive unit is exposed to the first through hole. The first through hole is filled with the conductive material. The conductive material is electrically connected to the conductive unit.

According to a second aspect of the present disclosure, a method of manufacturing conductive structure is provided. The manufacturing method includes the following steps: A first conductive layer is provided. A conductive unit is disposed on the first conductive layer. A circuit board is disposed on the first conductive layer. The conductive unit is exposed to a first through hole on the circuit board. The first through hole is filled with a conductive material, such that the conductive material is electrically connected to the conductive unit.

The disclosure will become apparent from the following detailed description of the specific but non-limiting embodiments. The following description is made with reference to the accompanying drawings.

DESCRIPTION OF EMBODIMENTS

Figure 1:
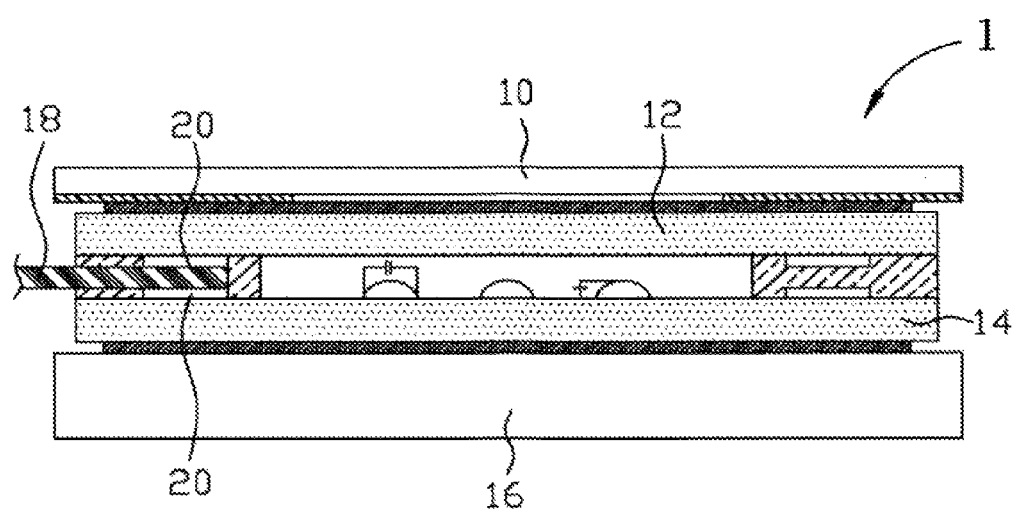
FIG. 1 shows a structural diagram of a conventional full flat touch panel.
Figure 2:
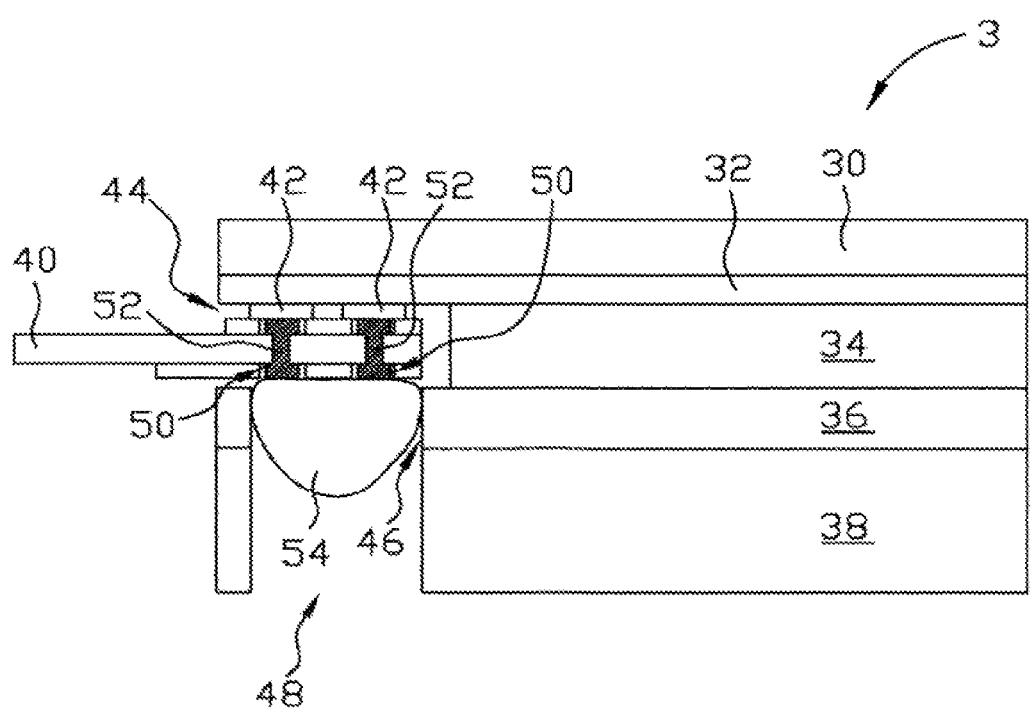
FIG. 2 shows a conductive structure according to an embodiment of the disclosure.

FIG. 2 shows a conductive structure 3 according to an embodiment of the disclosure. The conductive structure 3 includes a decoration film 30, a first conductive layer 32, an adhesive layer 34, a second conductive layer 36, a substrate 38 and a circuit board 40. Materials of the first conductive layer 32 and the second conductive layer 36 may be tin dioxide (SnO2), zinc oxide (ZnO) or other conductive materials. The adhesive layer 34 may be a double-sided adhesive tape. The substrate 38 may be a glass substrate or a plastic substrate. The circuit board 40 may be a flexible circuit board. The decoration film 30 may be a transparent or non-transparent thin film or base material. The conductive structure 3 can be applied in a panel, touch panel or other electronic devices.

In the present embodiment, two conductive units 42 are disposed on the first conductive layer 32. The conductive units 42 may be electrodes or conductive wires, and may be silver or other conductive materials. Note that the number of the conductive units 42 can be determined according to actual needs and is not limited to two as exemplified in FIG. 2. The second conductive layer 36 is disposed on the substrate 38 and is attached onto the first conductive layer 32 by an adhesive layer 34. When the second conductive layer 36 is disposed on the substrate 38 by the adhesive layer 34, an opening 44 near the conductivel unit 42 is leaved between the first conductive layer 32 and the second conductive layer 36. Besides, the second conductive layer 36 has a second through hole 46, and the substrate 38 has a third through hole 48. The second through hole 46 is communicated with the third through hole 48.

In the present embodiment, the circuit board 40 has two first through holes 50, and therefore a conductive copper wire (not illustrated) in the circuit board 40 is exposed to the first through hole 50. For example, the number of the first through hole 50 is identical to that of the conductive unit 42, but not limited thereto, and therefore the number of the first through hole 50 may be different from that of the conductive unit 42. During assembly, one end of the circuit board 40 having the first through hole 50 can be inserted into the opening 44, such that the conductive unit 42 is exposed to the corresponding first through hole 50 and the first through hole 50 is exposed to the second through hole 46 and the third through hole 48.

Next, each first through hole 50 is filled with a conductive material 52 through the second through hole 46 and the third through hole 48, such that the conductive copper wire of the circuit board 40 exposed to the first through hole 50 can be electrically connected to the conductive unit 42 through the conductive material 52. The conductive material 52 may be a conductive glue or other conductive materials. After the conductive material 52 is solidified, the second through hole 46 and the third through hole 48 are filled with an encapsulant 54 for encapsulating the first through hole 50 and the conductive material 52 to strengthen the structure and avoid the conductive material 52 being oxidized.

In addition, a metal material (not illustrated), such as gold or nickel, may be formed on an upper surface, a lower surface and an inner surface of each first through hole 50. The metal material enhances the bonding with the conductive copper wire and at the same time reduces the conduction resistance between the conductive copper wire and the conductive material 52 and the conductive unit 42.

Figure 3:
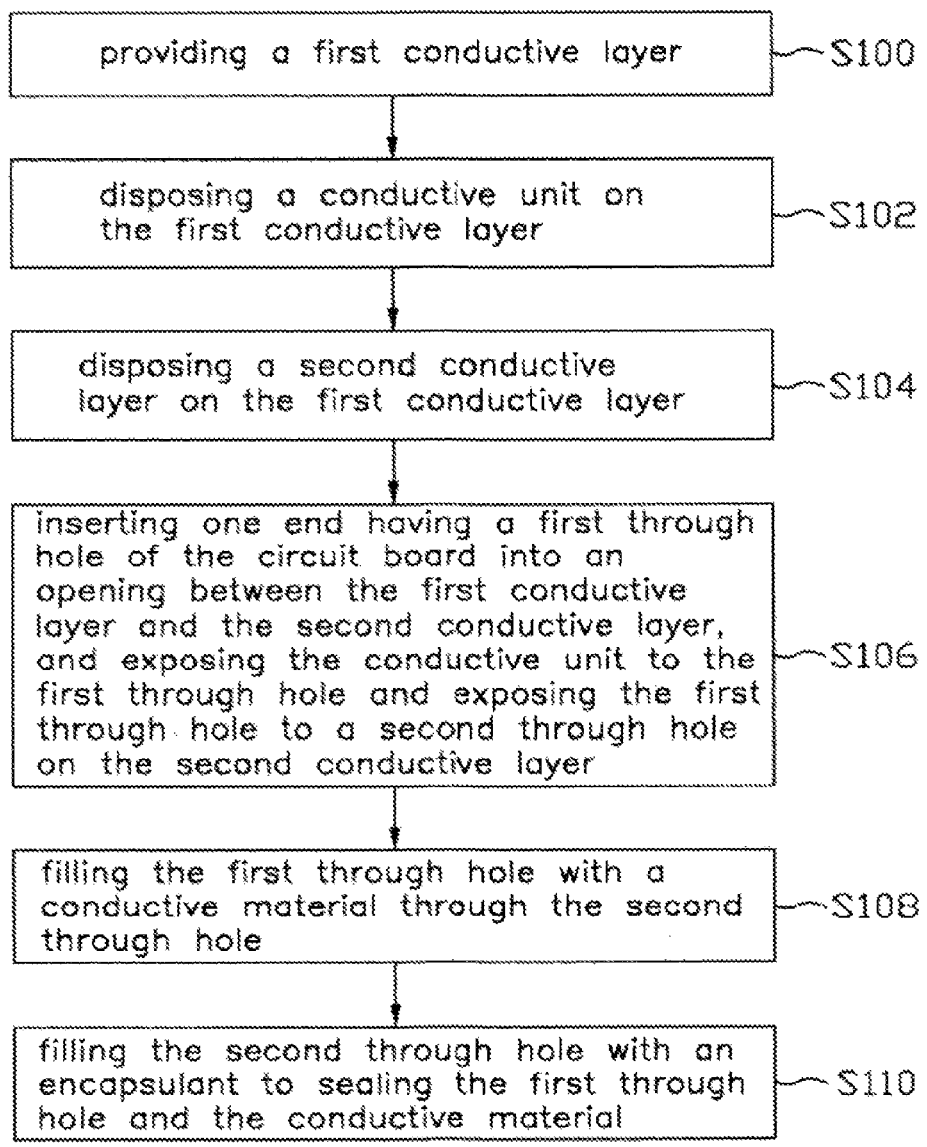
FIG. 3 shows a flowchart of a method of manufacturing the conductive structure shown in FIG. 2.

FIG. 3 shows a flowchart of a method of manufacturing the conductive structure shown in FIG. 2. Referring to FIG. 2 and FIG. 3, a method of manufacturing a conductive structure of the present disclosure includes the following steps:

Step S100: providing a first conductive layer 32;

Step S102: disposing a conductive unit 42 on the first conductive layer 32;

Step S104: disposing a second conductive layer 36 on the first conductive layer 32, wherein the second conductive layer 36 can be disposed on the first conductive layer 32 by an adhesive layer 34;

Step S106: inserting one end having a first through hole 50 of the circuit board 40 into an opening 44 between the first conductive layer 32 and the second conductive layer 36, and exposing the conductive unit 42 to the first through hole 50 and exposing the first through hole 50 to a second through hole 46 on the second conductive layer 36;

Step S108: filling the first through hole 50 with a conductive material 52 through the second through hole 46 on the second conductive layer 36;

Step S110: filling the second through hole 46 on the second conductive layer 36 with an encapsulant 54 to sealing the first through hole 50 and the conductive material 52.

In comparison to the prior art, the disclosure forms a through hole on the circuit board, and during assembly, the circuit board is directly disposed on the surface of the conductive layer, and the conductive unit is exposed to the through hole on the circuit board. Then, the through hole is filled with a conductive material and is the conductive material is solidified, such that the circuit board is electrically connected to the conductive unit on the conductive layer through the conductive material. Since the disclosure does not need a thermal compression bonding process, when it is applied to a touch panel, a smooth surface can be obtained accordingly.

While the disclosure has been described by way of example and in terms of a specific embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A conductive structure of a touch panel, comprising:
    a first conductive layer;
    a conductive unit disposed on the first conductive layer;
    a circuit board having a first through hole, wherein the circuit board is disposed on the first conductive layer, and the conductive unit is exposed to the first through hole;
    a conductive material filled in the first through hole and electrically connected to the conductive unit;
    a second conductive layer having a second through hole, wherein the second conductive layer is disposed on the first conductive layer and the circuit board, the first through hole of the circuit board and the conductive material are exposed to the second through hole;
    an encapsulant filled in the second through hole to seal the first through hole and the conductive material, so as to strengthen the conductive structure and avoid the conductive material being oxidized;
    an adhesive layer disposed between the first conductive layer and the second conductive layer; and
    a decoration film covering the first conductive layer.

2. The conductive structure according to claim 1, wherein the first conductive layer is composed of a material indium tin oxide (ITO).

3. The conductive structure according to claim 1, wherein the conductive unit is an electrode or a conductive wire.

4. The conductive structure according to claim 1, wherein the circuit board is a flexible circuit board.

5. The conductive structure according to claim 1, wherein the conductive material is a conductive glue.

6. The conductive structure according to claim 1, wherein the conductive structure further comprises a metal material formed on an upper surface, a lower surface and an inner surface of the first through hole.

7. The conductive structure according to claim 1, wherein the conductive structure further comprises a substrate, wherein the substrate includes a third through hole and is disposed on the second conductive layer, wherein the third through hole connects with the second through hole.

8. The conductive structure according to claim 1, wherein the second conductive layer is composed of a material ITO.

9. The conductive structure according to claim 7, wherein the substrate is a glass substrate or a plastic substrate.

* * * * *